United States Patent [19]
Huang et al.

[11] Patent Number: 5,943,582
[45] Date of Patent: *Aug. 24, 1999

[54] METHOD FOR FORMING DRAM STACKED CAPACITOR

[75] Inventors: Julie Huang; Shing-Long Lee, both of Hsin-Chu, Taiwan

[73] Assignee: Taiwan Semiconductor Manufacturing Co. Ltd., Hsin-Chu, Taiwan

[ * ] Notice: This patent is subject to a terminal disclaimer.

[21] Appl. No.: 08/851,115

[22] Filed: May 5, 1997

[51] Int. Cl.⁶ .................................................. H01L 21/20
[52] U.S. Cl. .................... 438/396; 438/253; 438/254; 438/397; 438/735; 438/737; 438/738
[58] Field of Search .................. 438/396, 397, 438/381, 253, 254, 735, 737, 738

[56] References Cited

U.S. PATENT DOCUMENTS

| | | | |
|---|---|---|---|
| 5,270,241 | 12/1993 | Dennison et al. | 438/396 |
| 5,273,925 | 12/1993 | Yamanaka | 438/396 |
| 5,403,767 | 4/1995 | Kim | 438/253 |
| 5,543,346 | 8/1996 | Keum et al. | 438/397 |
| 5,627,094 | 5/1997 | Chan et al. | 438/253 |
| 5,716,884 | 2/1998 | Hsue et al. | 438/254 |
| 5,736,450 | 4/1998 | Huang et al. | 438/396 |

*Primary Examiner*—Michael Trinh
*Assistant Examiner*—Edwin Oh
*Attorney, Agent, or Firm*—Tung & Associates

[57] ABSTRACT

The present invention discloses a method for forming DRAM stacked capacitors by utilizing a densified oxide layer as an etch-stop for the wet etching process of an upper oxide layer in forming a contact hole for the stacked capacitor and thus, eliminating the need of a silicon nitride etch-stop layer and the occurrence of numerous processing difficulties normally observed in such stacked capacitor forming process. The lower oxide layer can be formed by a BPTEOS chemistry while the upper oxide layer can be formed by an ozone-TEOS chemistry.

23 Claims, 2 Drawing Sheets

METHOD FOR FORMING DRAM STACKED CAPACITOR

FIELD OF THE INVENTION

The present invention generally relates to a method for forming dynamic random access memory (DRAM) stacked capacitor and more particularly, relates to a method for forming DRAM stacked capacitor without using a silicon nitride etch-stop layer by sequentially depositing two inter-poly-oxide layers of different chemistries such that the top layer has a wet etch rate substantially higher than the bottom layer when the contact hole for the capacitor is formed.

BACKGROUND OF THE INVENTION

DRAM cells have been widely used in modern semiconductor devices. They have been named as dynamic because the cells can retain information only for a limited time and they must be read and refreshed periodically. This is in contrast to a static random access memory (SRAM) cell which does not require periodic refresh signals in order to retain stored data. In a typical DRAM cell, the structure includes a transistor and a storage capacitor. When DRAM cells were first developed, planar type storage capacitors which occupy large wafer surface areas are used. As the circuit density increases in modern semiconductor devices where smaller chips are being made and are being packed with ever-increasing number of circuits, the specific capacitance of a storage capacitor must be increased in order to meet such demands.

Different approaches have been used in achieving higher capacitance on limited usage of wafer real estate. For instance, one solution is to store charges vertically in a trench which requires a deep trench formation and encounters significant processing difficulties. The second solution is to build a stacked capacitor on top of the transistor which allows a smaller cell to be built without losing storage capacity. The solution of using a stacked capacitor has become a more accepted and popular approach in the semiconductor fabrication industries.

In modern DRAM cells, smaller dimension and higher capacitance value per unit area are desirable characteristics for achieving high charge storage capacity. A DRAM capacitor is normally formed by two layers of a semi-conducting material and one layer of a dielectric material. For example, a widely used DRAM capacitor utilizes a thin oxide layer sandwiched between two polysilicon layers to produce a high capacitance capacitor cell. The capacitor can be built by stacking over the bit line on the surface of a silicon substrate. The effective capacitance of a stacked cell is increased over that of a conventional planar cell due to its increased surface area.

A typical 16-Mb DRAM cell 10 having a stacked capacitor 20 built on top is shown in FIG. 1. The DRAM cell 10 can be formed in the following manner. First, standard CMOS fabrication steps are used to form the transistor all the way through the gate oxide growth process. To form the word lines 12, a first polysilicon layer of approximately 2,500 Å thick is deposited and then doped with phosphorous. A thick layer of insulating material 16 such as TEOS (tetraethoxy silicate) oxide of approximately 3,000 Å is then deposited on top of the first polysilicon layer. By using standard photomasking processes, the two layers are etched by a plasma etching technique as a stack. After LDD implants are made in the silicon substrate, oxide spacers are formed on the polysilicon gate structure by depositing a thick layer of TEOS oxide of approximately 2,000 Å and then etched by a plasma process. Gates 12 and 14 are thus formed and covered by a thick insulating layer 16 of oxide. A source and drain mask is then applied to carry out an ion implantation process for forming the source and drain regions in the silicon substrate.

In the next fabrication step, photomasking is used to form window openings for the cell contact and plasma etching is used to remove any native oxide layer on the silicon substrate. A second polysilicon layer 22 of approximately 3,500 Å is then deposited and patterned by a photomask to form the lower electrode of the stacked capacitor 20. A dielectric layer 24 of a composite film of oxide-nitride-oxide (ONO) is deposited as the dielectric layer for the capacitor. The total thickness of the ONO composite film is approximately 70 Å. The ONO composite film can be formed by using a thin layer of native oxide as the first oxide layer, depositing a thin nitride layer on top and then oxidizing the nitride layer to grow a top oxide layer. To complete the fabrication of the stacked capacitor, a third polysilicon layer 24 of approximately 2,000 Å thick is deposited on top of the dielectric layer and then doped and patterned by a photomask to form an upper electrode. After the formation of the stacked capacitor, peripheral devices can be formed by masking and ion implantation, followed by the formation of a bit line 28 of a polysilicon/metal silicide material. A thick insulating layer 32 of BPSG or SOG is then deposited over the capacitor and reflowed to smooth out the topography and to reduce the step height. Other back-end-processes such as metalization to form metal lines 34 are used to complete the fabrication of the memory device 10.

The stacked capacitor 10 shown in FIG. 1 has been successfully used in 16 Mb DRAM devices. However, as device density increases to 256 Mb or higher, the planar surface required for building the conventional stacked capacitors becomes excessive and can not be tolerated. Furthermore, the topography of the device formed in FIG. 1 requires more difficult planarization processes to be performed on the DRAM device. For instance, a more recently developed method of chemical mechanical polishing (CMP) can not be used.

It is therefore an object of the present invention to provide a method for making DRAM stacked capacitor that does not have the drawbacks or shortcomings of the prior art methods.

It is another object of the present invention to provide a method for making DRAM stacked capacitor that does not require the use of a silicon nitride layer as an etch-stop.

It is a further object of the present invention to provide a method for making DRAM stacked capacitor that can be readily used in ultra-high density semiconductor devices.

It is another further object of the present invention to provide a method for making DRAM stacked capacitor by depositing two layers of oxide materials by different chemistries on a pre-processed silicon wafer.

It is yet another object of the present invention to provide a method for making DRAM stacked capacitor by depositing two layers of oxide by different chemistries wherein the top oxide layer has a substantially higher wet-etch rate then the bottom oxide layer.

It is still another object of the present invention to provide a method for making DRAM stacked capacitor by depositing two layers of oxide on a substrate wherein the bottom oxide layer acts as an etch-stop for the top oxide layer in a wet etch process.

It is still another further object of the present invention to provide a method for making DRAM stacked capacitors by depositing two layers of oxide wherein the bottom layer is deposited by a BPTEOS chemistry and the top layer is deposited by an ozone-TEOS chemistry.

It is yet another further object of the present invention to provide a method for making DRAM stacked capacitors by first forming polysilicon plugs and then cup-shaped lower and upper polysilicon electrodes on top of the plugs.

It is still another further object of the present invention to provide a method for making DRAM stacked capacitors by using a thin oxide-nitride-oxide composite film as the dielectric layer in the capacitor.

SUMMARY OF THE INVENTION

In accordance with the present invention, a DRAM stacked capacitor can be formed by the sequential deposition of two oxide layers and then etching the top oxide layer for a contact hole for the capacitor wherein the top oxide layer has a wet etch rate substantially higher than the bottom oxide layer so that no additional etch-stop layer is required.

In a preferred embodiment, a method for forming DRAM stacked capacitors can be carried out by the steps of first depositing a first oxide layer on a pre-processed wafer having transistors, word lines and lines built therein, then densifying the first oxide layer in a planarization process, then forming a first contact window and depositing a first polysilicon layer forming polysilicon plugs for electrical communication with the wafer, then depositing a second oxide layer on the polysilicon plugs and the first oxide layer, the second oxide layer has a substantially faster wetetch rate than to the first oxide layer, then forming a second contact window in the second oxide layer and stopping at the first oxide layer, and depositing layers of polysilicon and dielectric material forming the stacked capacitors.

The present invention is further directed to a method for forming DRAM stacked capacitor by the operating steps of depositing a first oxide layer from a borophosphor-TEOS (BPTEOS) reactant on a pre-processed wafer including transistors, word lines and gate lines, then densifying the first oxide layer in a planarization process, then forming a first contact window and depositing a first polysilicon layer to form polysilicon plugs for electrical communication with the wafer, then depositing a second oxide layer from an ozone-TEOS reactant on the polysilicon plugs and the first oxide layer, then forming a second contact window in the second oxide layer stopping at the first oxide layer, and depositing layers of polysilicon and dielectric material forming the stacked capacitor.

The present invention is also directed to a stacked capacitor formed in a DRAM cell without using a silicon nitride layer as etch-stop including a lower portion formed of a polysilicon plug for electrical communication between a semi-conducting substrate and an upper capacitor portion, and a cup-shaped upper portion formed by two polysilicon layers and a dielectric layer sandwiched therein, wherein one of the polysilicon is in electrical communication with the polysilicon plug.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a method for making a DRAM stacked capacitor by sequentially depositing at least two oxide layers wherein a top oxide layer has a substantially higher wet-etch rate than the bottom layer so that a contact window for the capacitor can be readily formed in the top oxide layer by a wet-etch process that stops at the surface of the bottom oxide layer. The need for a silicon nitride layer as an etch-stop is eliminated in the preferred embodiment and thus problems caused by the cracking of the nitride layer during high temperature deposition of an oxidenitride-oxide layer can be avoided.

In a copending application, Attorney docket number 67,200-020 (Ser. No. 08/851,618, filed May 6, 1997, pending), assigned to the common assignee of the present invention, a method for forming stacked capacitors in DRAM devices in which a polysilicon plug is first formed to contact a wafer and then upper and lower electrodes are formed on the plug by using a silicon nitride etch-stop layer to remove a dielectric layer is disclosed. A drawback for the process is the requirement of the silicon nitride etch-stop layer. The nitride layer causes processing difficulties such as the cracking of the layer and possible contamination of the fabrication process. For instance, during the final processing steps for forming the dielectric layer and the upper cell plate, a dielectric layer of ONO must be deposited at a high temperature of approximately 800° C. This high deposition temperature causes the cracking and the separation of the silicon nitride layer from the inter-poly-oxide layer that it is deposited on.

In an improved process, i.e., in a preferred embodiment of the present invention, the need for the silicon nitride etch-stop layer 38 can be eliminated. The process steps for the preferred embodiment is illustrated in FIGS. 2A through 2H.

In the preferred embodiment of the present invention, the elimination of the silicon nitride layer is accomplished by incorporating a novel processing step of annealing the first oxide layer deposited. The annealing, or the densification step, can be conducted simultaneously with the planarization (or reflow) step for the inter-poly-oxide layer. The densification step can also be conducted by any other processes.

Figure 1:
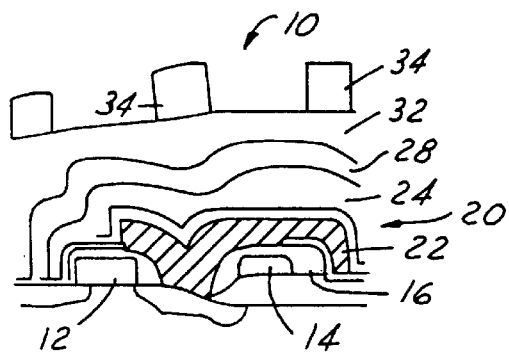
FIG. 1 is an enlarged, cross-sectional view of a conventional stacked capacitor DRAM cell.
Figure 2A:
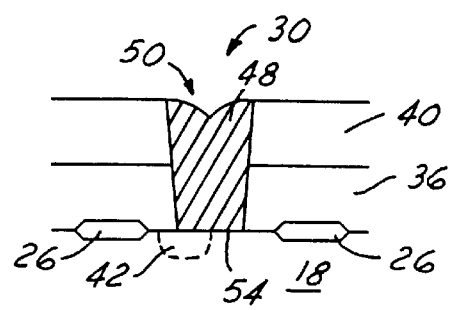
FIG. 2A is an enlarged, cross-sectional view of a preferred embodiment of the present invention device showing a polysilicon plug formed in the first two inter-poly-oxide layers.

Referring initially to FIG. 2A, wherein a preferred embodiment of the present invention device 30 is shown. An IPO-1 oxide layer 36 is deposited to a thickness of between 4000~6000 Å, while an IPO-2 oxide layer 40 is deposited to a thickness of between 3000~4000 Å. Between the two IPO layers, a conductive layer (not shown) is deposited to form bit lines (not shown) on the IPO-1 layer 36 by a chemical vapor deposition technique. Both the IPO-1 and the IPO-2 layers are densified later in a reflow process to achieve planarization. This is an important processing step for the present invention since it contributes significantly in a latter wet-etch process during which the etch rate of the IPO-2 layer is substantially lower than the oxide layer that is subsequently deposited on top.

A buried contact 54 and contact window 50 is then formed by photomasking and etching the IPO-2 layer 40 and the IPO-1 layer 36 by a reactive ion etching process. A conductive plug 48 is formed by first depositing a conductive layer (not shown) to make electrical communication with the buried contact 54. The conductive plug 48 can be formed of polysilicon or any other suitable conductive material. The thickness of the conductive layer (not shown) deposited for forming the plug 48 can be between about 5000 Å and about 12,000 Å or of any suitable thickness that is sufficient for filling the contact hole 50 completely.

After the contact hole 50 is filled, the conductive layer (not shown) is etched back in a wet etching process using the densified IPO-2 layer 40 as an etch stop. The conductive (or polysilicon) plug 48 provides electrical connection with the silicon substrate 18 for the DRAM stacked capacitor that is to be built. The thickness of the conductive layer deposited for forming the plug 48 is substantially larger than the other conductive layers later deposited for forming the electrodes of the stacked capacitor.

Figure 2B:
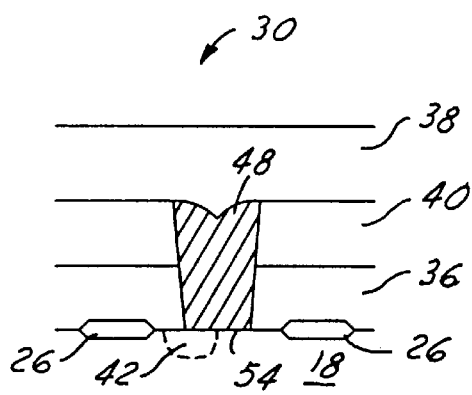
FIG. 2B is an enlarged, cross-sectional view of the preferred embodiment of the present invention device of FIG. 2A having a third inter-poly-oxide layer deposited on top.
Figure 2C:
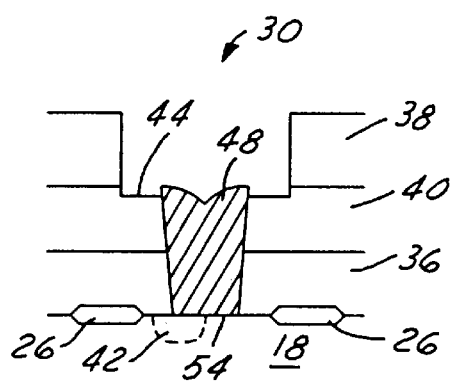
FIG. 2C is an enlarged, cross-sectional view of the preferred embodiment of the present invention device of FIG. 2B having a contact window formed in the third inter-poly-oxide layer.

In the next step of the process, as shown in FIG. 2B, a third inter-poly-oxide IPO-3 layer 38 is deposited on top of device 30. The IPO-3 layer can be deposited of ozone-TEOS chemistry in a sub-ambient chemical vapor deposition process. The IPO-3 layer 38 is not densified by a reflow process. The density difference between the IPO-3 layer 38 and the IPO-2 layer 40 enables the preferred embodiment of the present invention method to be carried out.

In the next step of the fabrication process a wet dip or wet etch is used to form a contact hole 44. The contact hole 44 also defines the base portion of the stacked capacitor to be formed in latter processing steps. In a typical wet dip method, a 10:1 BOE etchant is used to form the contact hole 44. It has been found that the selectivity of 10:1 BOE between the densified IPO-2 layer (formed by a BPTEOS chemistry and densified) and the IPO-3 layer (formed by an ozone-TEOS method without densification) is at least 5:1. Even higher selectivities such as 7:1 has also been achieved. The large selectivity enables easy process control of the wet dip method since an end point for the etch process can be easily detected. The end point for etching the contact hole 44 through the IPO-3 layer 38 can thus be detected and the etch process can be stopped at the interface with the IPO-2 layer 40. A good uniformity of the etched surface in the contact hole 44 is another desirable benefit made possible by the present invention more preferred embodiment. The method further eliminates the requirement of an etch-stop layer and thus prevents the occurrence of an over-etching problem which can possible occur under the nitride layer and cause the formation of voids or pockets.

Figure 2D:
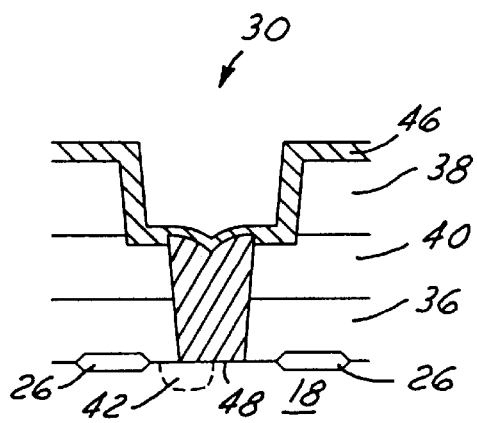
FIG. 2D is an enlarged, cross-sectional view of the preferred embodiment of the present invention device of FIG. 2C having a lower electrode of polysilicon deposited in the contact window.

In the next step of the process, as shown in FIG. 2D, a polysilicon layer 46 of approximately 1000~2000 Å thick is conformally deposited on top of device 30. A lower electrode for the stacked capacitor can then be defined and formed from the polysilicon layer 46. The layer 46 makes intimate contact with the polysilicon plug 48 and thus establishes good electrical communication with the silicon substrate 18.

Figure 2E:
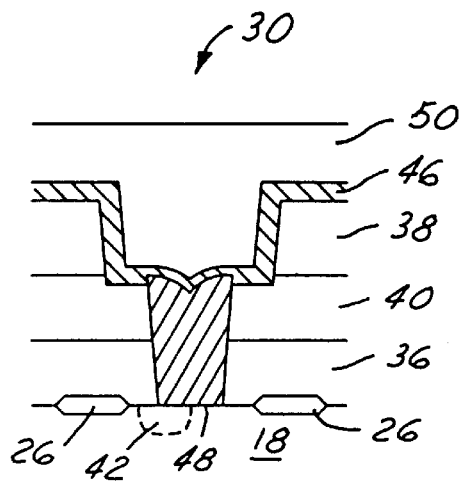
FIG. 2E is an enlarged, cross-sectional view of the preferred embodiment of the present invention device of FIG. 2D having a fourth inter-poly-oxide layer deposited on top.
Figure 2F:
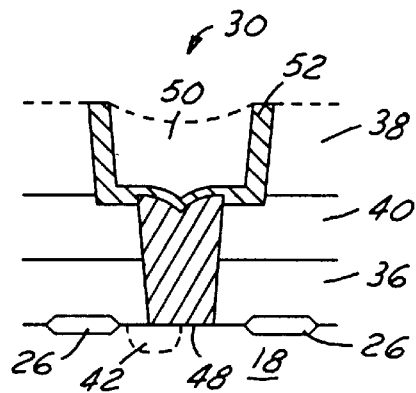
FIG. 2F is an enlarged, cross-sectional view of the preferred embodiment of the present invention device of FIG. 2E having the fourth inter-poly-oxide layer partially removed by a wet-etch method.
Figure 2G:
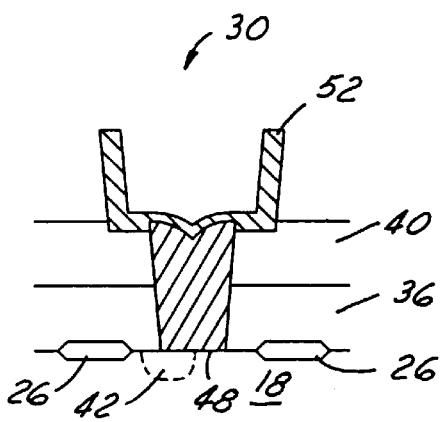
FIG. 2G is an enlarged, cross-sectional view of the preferred embodiment of the present invention device of FIG. 2F having the residual fourth inter-poly-oxide layer removed.
Figure 2H:
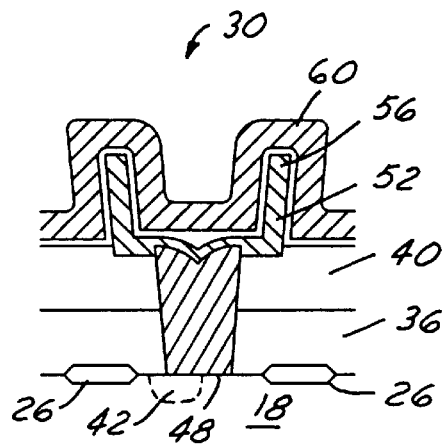
FIG. 2H is an enlarged, cross-sectional view of the preferred embodiment of the present invention device of FIG. 2G having a dielectric layer and an upper electrode layer deposited on top.

In a subsequent step, as shown in FIG. 2E, a fourth inter-poly-oxide layer 50, or IPO-4, is deposited on top of the device 30. The IPO-4 layer 50 can also be deposited of ozone-TEOS chemistry in a sub-ambient chemical vapor deposition process. The IPO-4 layer 50 is not densified by a reflow process. The density difference between the IPO-4 layer 50 and the IPO-2 layer 40 enables the latter to be used as an etch-stop layer. After a wet etch process on the IPO-4 layer 50 is carried out, the lower electrode 52 of the stacked capacitor is defined while residual oxide 50 remains on the polysilicon layer. The residual oxide 50 and 38 is then removed in a second wet dip method which stops at the IPO-2 layer 40 such that the device 30 is ready for the sequential deposition of a dielectric layer 56 and an upper polysilicon layer 60 for forming the cell plate. This is shown in FIG. 2H. Final back end processes are similar to those used in the semiconductor industry to complete the fabrication of the stacked capacitor 30.

The present invention method has therefore been demonstrated in a preferred embodiment. In the preferred embodiment, the use of a silicon nitride etch-stop layer is eliminated by first densifying a lower inter-poly-oxide layer such that the selectivity difference exhibited in a latter wet etch process enables the lower oxide layer to act as an etch-stop during the formation of the stacked capacitor. The embodiment eliminates processing difficulties such as the cracking of the nitride layer during a high-temperature deposition of an oxide-nitride-oxide layer as the capacitor dielectric. The elimination of the nitride layer further prevents the formation of voids or pockets under the nitride due to over-etch during a wet etch process.

While the present invention has been described in an illustrative manner, it should be understood that the terminology used is intended to be in a nature of words of description rather than of limitation.

Furthermore, while the present invention has been described in terms of a preferred and a more preferred embodiment, it is to be appreciated that those skilled in the art will readily apply these teachings to other possible variations of the inventions.

The embodiment of the invention in which an exclusive property or privilege is claimed are defined as follows:

1. A method for forming stacked capacitors in a semiconductor device comprising the steps of:

depositing a first oxide layer on a pre-processed wafer having transistors, forming a first contact window and depositing a first conductive layer forming a conductive plug for electrical communication with the wafer, depositing a second oxide layer on said conductive plug and said first oxide layer, said second oxide layer having a substantially higher wet-etch rate than said first oxide layer, forming a second contact window in said second oxide layer stopping at said first oxide layer, and depositing layers of conductive and dielectric material forming said stacked capacitors.

2. A method according to claim 1 further comprising the step of densifying said first oxide layer prior to the formation of said first contact window.

3. A method according to claim 1, wherein the wet-etch rate for said second oxide layer is at least five times faster than the wet-etch rate for said first oxide layer.

4. A method according to claim 1, wherein said conductive layer is deposited of polysilicon.

5. A method according to claim 1, wherein said first oxide layer being formed from a borophosphor TEOS (BPTEOS) reactant and said second oxide layer being formed from an ozone-TEOS reactant.

6. A method according to claim 1, wherein said first and said second oxide layers are inter-poly-oxide layers.

7. A method according to claim 1 further comprising the step of densifying said first oxide layer in a planarization process conducted at a temperature of not less than 950° C.

8. A method according to claim 1, wherein said step of depositing layers of conductive and dielectric material comprises:

depositing a second conductive layer forming a lower electrode, depositing a dielectric layer on top of said second conductive layer, and depositing a third conductive layer forming an upper electrode.

9. A method according to claim 8, wherein said dielectric material layer is an oxide-nitride-oxide composite film.

10. A method according to claim 1, wherein said step of depositing layers of conductive and dielectric material comprises:

depositing a second conductive layer forming a lower electrode, depositing a third oxide layer on said second conductive layer, said third oxide layer having a substantially higher wet-etch rate than said first oxide layer, wet etching partially said third oxide layer and said second conductive layer exposing said second oxide layer and forming a lower electrode for said stacked capacitor, wet etching and removing a residual third oxide layer and a residual second oxide layer, depositing a dielectric layer on top of said second conductive layer and forming an insulator for said stacked capacitor, and depositing a third conductive layer and forming an upper electrode.

11. A method according to claim 1 further comprising the step of stopping the formation of said second contact window in said second oxide layer at an end point in a wet-etch process.

12. A method according to claim 1, wherein a top surface of said first oxide layer serves as an etch-stop surface.

13. A method according to claim 1, wherein said semiconductor device is a DRAM cell.

14. A method according to claim 1, wherein the wet-etch rate for said second oxide layer is substantially faster than the wet-etch rate for said first oxide layer when exposed to a 10:1 BOE etchant.

15. A method for forming stacked capacitor in a DRAM cell comprising the steps of:

depositing a first oxide layer from a borophosphor TEOS (BPTEOS) reactant on a pre-processed wafer including transistors, forming a first contact window and depositing a first polysilicon layer forming a polysilicon plug for electrical communication with the wafer, depositing a second oxide layer from an ozone-TEOS reactant on said polysilicon plug and said first oxide layer, forming a second contact window in said second oxide layer stopping at said first oxide layer, and depositing layers of polysilicon and dielectric material forming said stacked capacitor.

16. A method according to claim 15, wherein said first and said second contact windows are formed by a wet-etch method.

17. A method according to claim 15, wherein said first oxide layer is densified.

18. A method according to claim 15, wherein said first oxide layer is densified at a temperature of not less than 950° C.

19. A method according to claim 15, wherein said forming step for said second contact window in the second oxide layer is carried out in a wet-etch method.

20. A method according to claim 15, wherein said second contact window is formed by an etchant having substantially higher selectively for said second oxide layer than for said first oxide layer.

21. A method according to claim 20, wherein said etchant is a 10:1 BOE solution.

22. A method according to claim 15, wherein said forming step for said stacked capacitor comprises:

depositing a second polysilicon layer forming a lower electrode, depositing a dielectric layer on top of said second polysilicon layer, and depositing a third polysilicon layer forming an upper electrode.

23. A method according to claim 22, wherein said dielectric material layer is an oxide-nitride-oxide composite film.

* * * * *